United States Patent
Hong et al.

(10) Patent No.: US 8,329,386 B2
(45) Date of Patent: Dec. 11, 2012

(54) METHOD TO ASSEMBLE NANO-STRUCTURE ON A SUBSTRATE AND NANO-MOLECULE DEVICE COMPRISING NANO-STRUCTURE FORMED THEREBY

(75) Inventors: Byung You Hong, Gyeonggi-do (KR); Hyung Jin Kim, Gyeonggi-do (KR); Yong Han Roh, Gyeonggi-do (KR)

(73) Assignee: Sungkyunkwan University Foundation for Corporate Collaboration, Gyeonggi-Do (KR)

( * ) Notice: Subject to any disclaimer, the term of this patent is extended or adjusted under 35 U.S.C. 154(b) by 400 days.

(21) Appl. No.: 12/704,899

(22) Filed: Feb. 12, 2010

(65) Prior Publication Data

US 2010/0216076 A1    Aug. 26, 2010

(30) Foreign Application Priority Data

Feb. 18, 2009    (KR) ........................ 10-2009-0013339

(51) Int. Cl.
    *G03F 7/26*    (2006.01)
(52) U.S. Cl. ........................................ 430/324
(58) Field of Classification Search .................. 430/325, 430/324, 314, 323
    See application file for complete search history.

(56) References Cited

U.S. PATENT DOCUMENTS

2005/0037276 A1* 2/2005 Argitis et al. .............. 430/270.1

FOREIGN PATENT DOCUMENTS

KR    1020100025603 A    3/2010

OTHER PUBLICATIONS

Wang, Michael C.P. et al, Materials Today, Directed Assembly of Nanowires, vol. 12, No. 5, May 2009.*

* cited by examiner

*Primary Examiner* — Kathleen Duda
*Assistant Examiner* — Caleen Sullivan
(74) *Attorney, Agent, or Firm* — Renner, Otto, Boisselle & Sklar, LLP

(57) ABSTRACT

A method of selectively positioning nanostructures on a substrate is provided which includes: a first step of forming a photoresist pattern on the substrate and then control the line width of the photoresist pattern in a nano unit to form a nanometer photoresist layer; a second step of forming a protective layer for preventing adsorption of a nano-material in a patter-unformed area on the substrate on which the nanometer photoresist layer has been formed; a third step of removing the photoresist layer formed on the substrate; a fourth step of forming a positively-charged or negatively charged adsorbent layer in the area from which the photoresist layer has been removed; and a fifth step of applying a nano-material-containing solution charged in the opposite polarity of the adsorbent layer to the substrate on which the adsorbent layer has been formed.

15 Claims, 6 Drawing Sheets

METHOD TO ASSEMBLE NANO-STRUCTURE ON A SUBSTRATE AND NANO-MOLECULE DEVICE COMPRISING NANO-STRUCTURE FORMED THEREBY

CROSS REFERENCE TO PRIOR APPLICATIONS

This application claims priority of Korean Patent Application No. 10-2009-0013339 filed 18 Feb. 2009, which is hereby incorporated herein by reference in its entirety.

BACKGROUND

1. Field of the Invention

The present invention relates to a method of manufacturing a selective nanoline, and more particularly, to a method of selectively arranging and positioning nanostructures on a substrate.

2. Description of the Related Art

With the recent advancement in semiconductor technology, electronic elements have decreased in size to a nanometer size and have increased in a degree of integration. Particularly, elements such as CMOS have been widely used in the field of large-scaled integrated circuits and line widths of the elements have decreased with the increase in a degree of integration. Nano-elements have been drastically studied with the decrease in size of the elements. A process of arranging nanometer lines at specific positions and in specific directions of a substrate is necessary for manufacturing a circuit using nanostructures. However, since the sizes of the nanostructures are very small, it is very difficult to control the nanostructures. As techniques for solving this problem, a flow cell method, a method using linker molecules, and a method using a slippery molecular film are known.

In the flow cell method developed by C. M. Lieber et, al. of the Harvard university, nanolines are derived to be arranged in a flow direction by adsorbing the nanolines at specific positions on a solid surface and then causing a fluid to flow thereon to adjust the direction of the nanolines. In this case, many nanolines can be arranged in the same direction in a large area, but it is very difficult to adjust the direction of the nanolines in a local area.

In the method of arranging carbon nano-tubes on a solid surface using a linker molecular film, two different molecular films are patterned on the solid surface and nanolines are adsorbed at specific positions using different degrees of adsorption of the nanolines between the surfaces of the molecular films, whereby the nanolines are arranged in the direction in which the molecular films are patterned. In this case, since no flow cell is used at all to arrange the nanolines and the nanolines are arranged in the directions in which the molecular films are locally patterned, it is possible to locally adjust the directions and positions of the nanolines as wanted. However, this method has a problem that the nanolines are always adsorbed using the molecules having chemical groups as a linker, the nanolines or the samples may be contaminated.

In the method using a slippery molecular film, a solid surface is patterned with a slippery molecular film and nanostructures to be adsorbed slide onto the solid surface from the slippery molecular film, whereby the nanostructures are adsorbed directly onto the solid surface. In this case, desired nanostructures can be selectively positioned and arranged on the solid surface, but it is very difficult to selectively arrange and control a single nanostructure.

SUMMARY

An advantage of some aspects of the invention is that it provides a method of selectively arranging and positioning nanostructures using an electrostatic attractive force.

According to an aspect of the invention, there is provided a method of selectively positioning nanostructures on a substrate, including: a first step of forming a photoresist pattern on the substrate and then control the line width of the photoresist pattern in a nano unit to form a nanometer photoresist layer; a second step of forming a protective layer for preventing adsorption of a nano-material in a patter-unformed area on the substrate on which the nanometer photoresist layer has been formed; a third step of removing the photoresist layer formed on the substrate; a fourth step of forming a positively-charged or negatively charged adsorbent layer in the area from which the photoresist layer has been removed; and a fifth step of applying a nano-material-containing solution charged in the opposite polarity of the adsorbent layer to the substrate on which the adsorbent layer has been formed.

According to the above-mentioned configuration, the surface potential of the adsorbent layer can be controlled so that the material adsorbed in the adsorbent layer forms nanostructures. The surface potential of the adsorbent layer can be controlled by adjusting the line width of the adsorbent layer. The line width of the adsorbent layer can be easily controlled by adjusting the line width of the photoresist pattern.

Here, the first step of controlling the line width of the photoresist pattern may employ an asking process. The protective layer in the second step may be formed of OTS (Octadecyl Trichloro Silane) or DLC (Diamond-Like Carbon).

The positively-charged adsorbent layer in the fourth step may be formed of APS (AminoPropyltriethoxy Silane) and the negatively-charged adsorbent layer may be formed of MHA (16-MercaptoHexadecanonic Acid).

The fifth step of applying the nano-material-containing solution may include causing a nanostructure-containing solution to flow on the surface of the substrate which is inclined and which has the adsorbent layer formed thereon or immersing the substrate having the adsorbent layer formed thereon in the nano-material-containing solution and drawing the substrate to one side. The method may further include a sixth step of applying a second nano-material-containing solution, which is charged in the opposite polarity of the nanostructures, to the substrate on which the negatively-charged or positively-charged nanostructures are selectively positioned in the fifth step.

According to another aspect of the invention, there is provided a method of selectively positioning nanostructures on a substrate, including: a first step of forming a photoresist pattern on the substrate; a second step of forming a first adsorbent layer, which is positively or negatively charged, in a pattern-unformed area on the substrate having the photoresist layer formed thereon; a third step of removing the photoresist layer formed on the substrate; a fourth step of forming a second adsorbent layer, which is charged in the opposite polarity of the first adsorbent layer, in an area from which the photoresist layer has been removed; and a fifth step of applying a first nano-material-containing solution which is positively charged and a second nano-material-containing solution which is negatively charged to the substrate on which the first and second adsorbent layers have been formed.

According to this configuration, by forming two adsorbent layers charged in opposite polarities on a single substrate, it is possible to form two types of nanostructures on the substrate, without controlling the line widths of the nanolines in the nano unit using the interaction of the magnetostatic attractive and repulsive forces.

Here, the positively-charged adsorbent layer may be formed of APS (AminoPropyltriethoxy Silane) and the negatively-charged adsorbent layer may be formed of MHA (16-MercaptoHexadecanonic Acid).

The first nano-material-containing solution and the second nano-material-containing solution may be sequentially applied in the fifth step. Alternatively, a solution containing both a first nano-material and a second nano-material may be applied in the fifth step.

The fifth step of applying the nano-material-containing solution may include causing a nanostructure-containing solution to flow on the surface of the substrate which is inclined and which has the adsorbent layer formed thereon or immersing the substrate having the adsorbent layer formed thereon in the nano-material-containing solution and drawing the substrate to one side. The method may further include a sixth step of applying a second nano-material-containing solution, which is charged in the opposite polarity of the nanostructures, to the substrate on which the negatively-charged or positively-charged nanostructures are selectively positioned in the fifth step.

According to another aspect of the invention, there is provided a nano-molecular device including the nanostructures formed using the above-mentioned method.

According to the above-mentioned configurations, it is possible to selectively arrange and position the nanostructures and to easily form new nanostructures.

The above-mentioned nanostructures or composite nanostructures can be applied to a nano-molecular device.

DESCRIPTION OF EXEMPLARY EMBODIMENTS

Hereinafter, exemplary embodiments of the invention will be described in detail with reference to the accompanying drawings.

FIGS. 1A to 1F are diagrams schematically illustrating a procedure of selectively positioning nanostructures on a substrate according to an embodiment of the invention.

Figure 1:
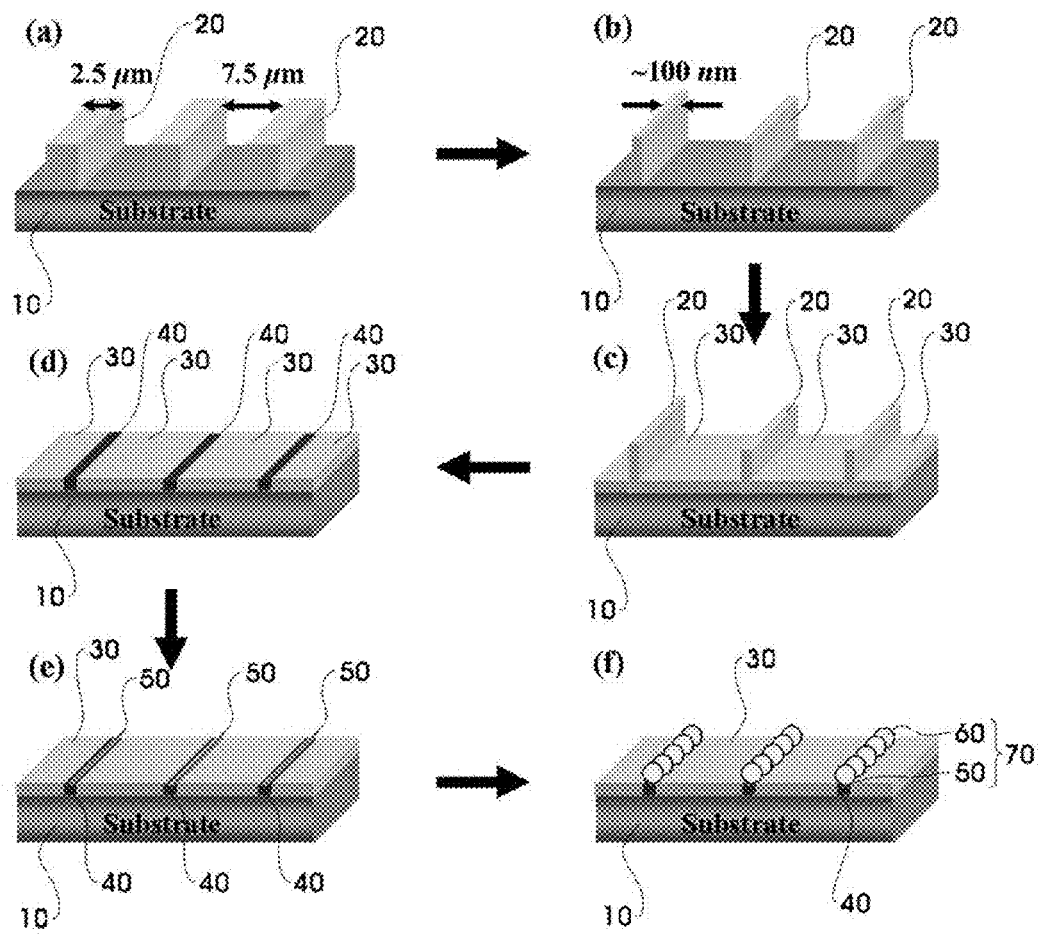
FIGS. 1A to 1F are diagrams schematically illustrating a procedure of selectively positioning nanostructures on a substrate according to an embodiment of the invention.

FIG. 1A shows a state where a photoresist pattern having a line width in the micrometer unit is formed on a substrate.

The substrate 10 may employ an Si wafer, a wafer having SiO2 deposited thereon, a glass substrate, a glass substrate coated with a transparent conductive oxide film, a flexible substrate such as polyimide. A photoresist pattern 20 having a line width in the micrometer unit is formed on the substrate 10 using a photolithography process. Here, the photoresist pattern may be formed in an intersecting or lattice shape, not a single straight line.

FIG. 1B shows a state where a photoresist pattern having a line width in the nanometer unit is formed on the substrate.

The step of adjusting the line width of the photoresist pattern 20 from the micrometer unit to the nanometer unit employs an ashing process. In the ashing process, the line width of the photoresist pattern 20 can be adjusted to the nanometer unit by adjusting the process time or power, and particularly, the line width of the photoresist pattern formed in an intersecting or lattice shape can be also adjusted to the nanometer unit. The line width of the photoresist pattern is adjusted to be 100 nm or less.

FIG. 1C shows a state where a protective layer is formed. A protective layer 30 for preventing the adsorption of a nano-material is formed in an area on the substrate in which the photoresist pattern 20 is not formed. The material of the protective layer may employ OTS (OctadecylTrichlororSilane) or DLC (Diamond-Like Carbon). The OTS is coated using a liquid coating method and the LDC is deposited using a plasma chemical vapor deposition (PECVD) method.

FIG. 1D shows a state where an adsorbent layer is formed in the area from which the photoresist pattern is removed.

A positively-charged or negatively-charged adsorbent layer 40 is formed in the areas from which the photoresist pattern located in the protective layer 30 is removed. Accordingly, the line width of the adsorbent layer 40 is equal to the line width of the photoresist pattern of which the line width is adjusted. APS (AminoPropyltriethoxySilane) or MHA (16-MercaptoHexadecanonic Acid) can be used as the material of the adsorbent layer 40. The APS is charged with positive charges and the MHA is charged with negative charges. The material of the adsorbent layer is determined depending on the electrostatic characteristic of the nano-material to be positioned on the substrate.

FIG. 1E shows a state where nanostructures are selectively positioned on the adsorbent layer.

Nanostructures 50 can be selectively formed on the adsorbent layer 40 using a solution containing the nano-material to be positioned on the adsorbent layer. The nano-material includes nano-materials such as carbon nano-tubes, nano-lines, metallic nanoparticles, semiconductor nanoparticles, magnetic nanoparticles, bio nanoparticles, and DNAs and new nano-materials formed by combinations thereof. The nano-material is charged positively or negatively and is adsorbed in the adsorbent layer 40 charged oppositely by an electrostatic attraction.

To form a circuit using the nanostructures, it is necessary to selectively position the nano-material at specific positions and to arrange the nano-material in a specific direction. Two methods are used to arrange the nanostructures. In the first method, a solution containing the nanostructures to be adsorbed is applied to the surface of the substrate on which the adsorbent layer is formed, the substrate is inclined in a specific direction to cause the solution to flow on the substrate, and the nanostructures are thus arranged in a predetermined direction. In the second method, the substrate on which the adsorbent layer is formed is immersed in the solution containing the nanostructures to be adsorbed, the substrate is drawn in a specific direction to cause the solution on the substrate to flow in a predetermined direction, and the nanostructures are thus arranged in a predetermined direction. In addition, when the nanostructures are adsorbed in the pattern having an intersecting shape or a lattice shape, not a simple linear shape, a procedure of inclining the substrate in a direction rotated by 90 degrees may be added or a procedure of drawing the substrate in a direction rotated by 90 degrees may be added.

A washing process may be added to remove the nanostructures adsorbed in portions other than the adsorbent layer 40.

FIG. 1F shows a state where other nano-materials are secured onto the nanostructures to form composite nanostructures.

Since the nanostructures 50 selectively positioned and arranged are charged positively or negatively as described above, a second nano-material 60 charged oppositely can be secured thereon to form the composite nanostructures 70. These composite nanostructures 70 can be formed in various forms using the electrostatic attraction and can be developed for various applications such as sensors amplifying a signal.

The method of selectively positioning nanostructures on a substrate uses the electrostatic attraction to selectively position the nanostructures, and employs the method of adjusting the line width of the adsorbent layer 40 to adjust the electrostatic attraction. Advantages of the invention will be confirmed from the following drawings.

FIGS. 2A to 2D are diagrams illustrating a state where DNA nanostructures are selectively positioned on an APS adsorbent layer. FIGS. 2A to 2D correspond to the line widths of the APS absorbent layer of 4 μm, 2 μm, 0.5 μm, and 100 nm, respectively, where it can be seen that the line widths of the nanostructures 50 decrease with an increase in line width of the adsorbent layer 40. Since the nanostructures are arranged along the centers of the adsorbent layer lines, not along the entire adsorbent layer 40, it can be seen that proper nanolines are formed even when the adsorbent layer 40 has a line width of about 100 nm.

Figure 3:
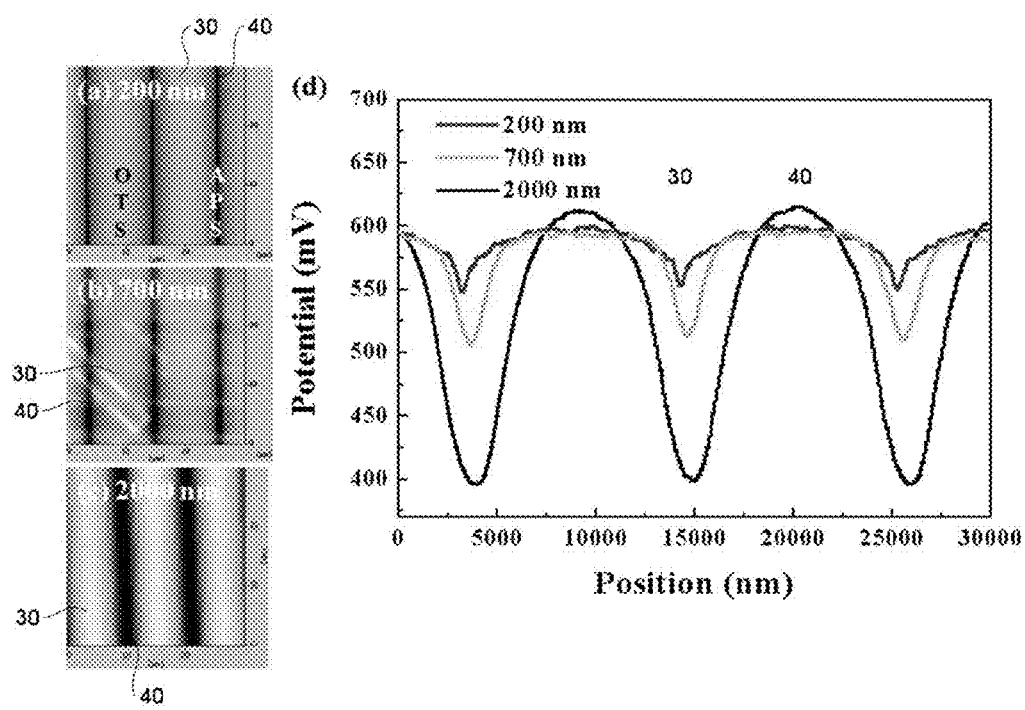
FIG. 3 is a diagram illustrating potential energy corresponding to line widths of the APS adsorbent layer.

FIG. 3 is a diagram illustrating the potential energy corresponding to the line width of the APS adsorbent layer. It can be seen from the drawing that the potential energy of the surface decreases as the line width of the adsorbent layer 40 decreases. Accordingly, it is possible to adjust an amount of adsorbed nanostructures using this fact.

Figure 4:
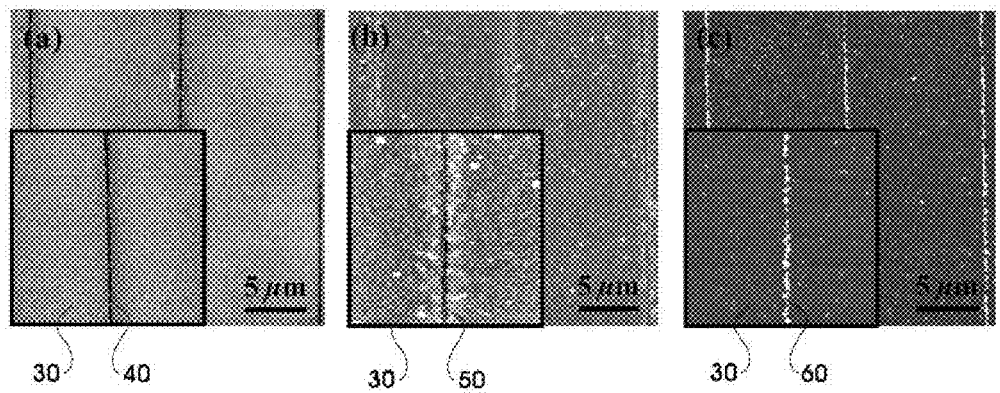
FIGS. 4A to 4C are diagrams illustrating a state where composite nanostructures are formed according to the embodiment of the invention.

FIGS. 4A to 4C are diagrams illustrating a state where the composite nanostructures are formed according to the embodiment of the invention. FIG. 4A shows a state where the APS adsorbent layer in the nanometer unit is formed, FIG. 4B shows a state where DNA nanostructures are formed on the APS adsorbent layer, and FIG. 4C shows a state where gold nanoparticles (AuNPs) are secured onto the DNA nanostructures to form composite nanostructures.

Figure 5:
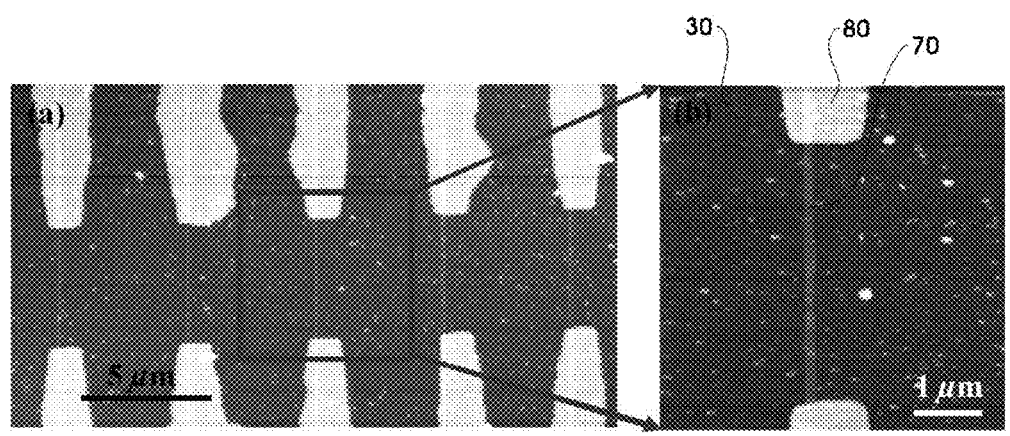
FIGS. 5A and 5B are diagrams illustrating a state where the composite nanostructure according to the embodiment of the invention is used in a nano-device.

The nanostructures or the composite nanostructures according to the invention can be applied to an electronic device. FIGS. 5A and 5B are diagrams illustrating a state where the composite nanostructures are used in a nano device. It can be seen from the drawings that electrodes 80 formed in the electronic device are properly connected with the composite nanostructures 70 according to the invention, whereby a nano-molecular device can be formed using the nanostructures or the composite nanostructures selectively positioned according to the invention.

Figure 6:
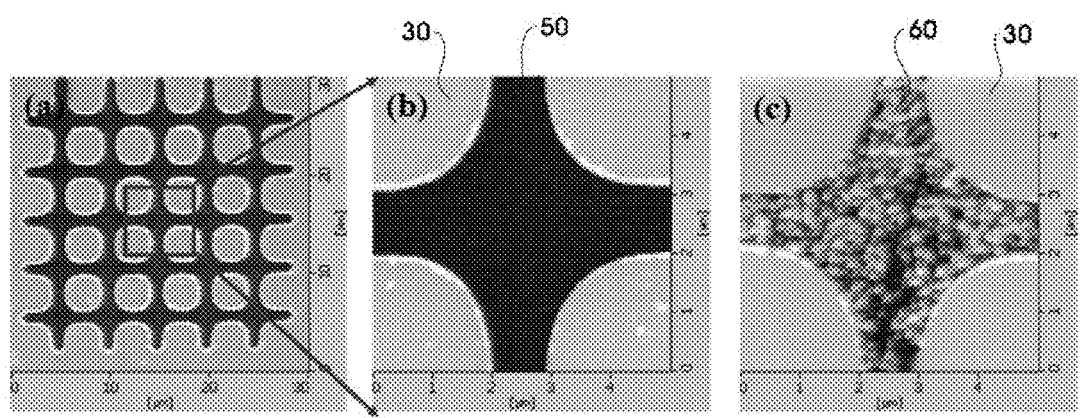
FIGS. 6A to 6C are diagrams illustrating a state where composite nanostructures of a lattice shape are formed according to the embodiment of the invention.

FIGS. 6A to 6C are diagrams illustrating a state where the lattice-like composite nanostructures are formed according to the embodiment of the invention. FIG. 6A shows a lattice-like pattern, FIG. 6B shows a state where DNA nanostructures are formed on the APS adsorbent layer, and FIG. 6C shows a state where gold nanoparticles (AuNPs) are secured onto the DNA nanostructures to form composite nanostructures.

In the invention in which the nanostructures are selectively adsorbed using the electrostatic attraction, it is possible to form oppositely-charged nanostructures using the oppositely-charged adsorbent layers, as well as to adjust the characteristics of the nanostructures by adjusting the line width of the adsorbent layer.

FIGS. 7A to 7F are diagrams schematically illustrating a procedure of selectively positioning nanostructures on a substrate according to another embodiment of the invention.

Figure 7:
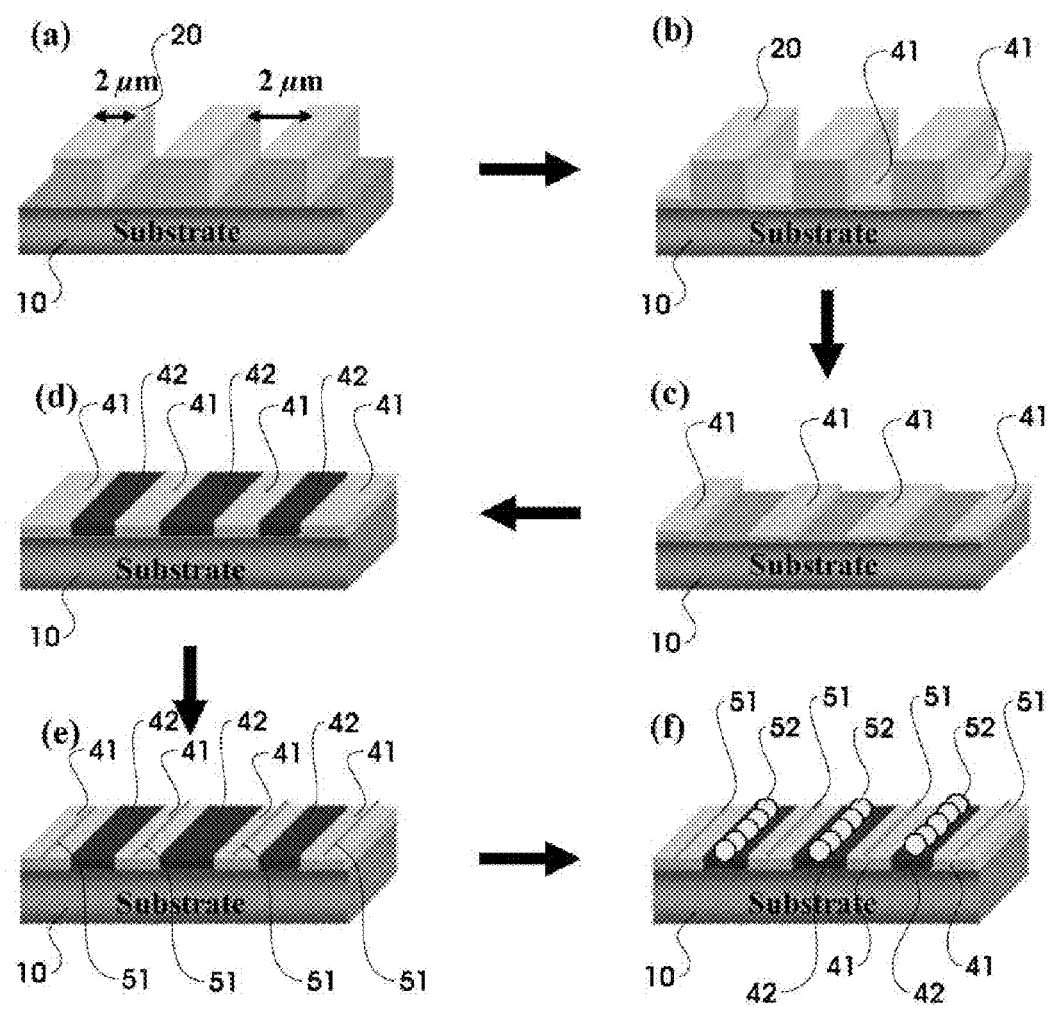
FIGS. 7A to 7F are diagrams schematically illustrating a procedure of selectively positioning nanostructures on a substrate according to another embodiment of the invention.

FIG. 7A shows a state where a photoresist pattern having a line width in the micrometer unit is formed on a substrate.

Figure 2:
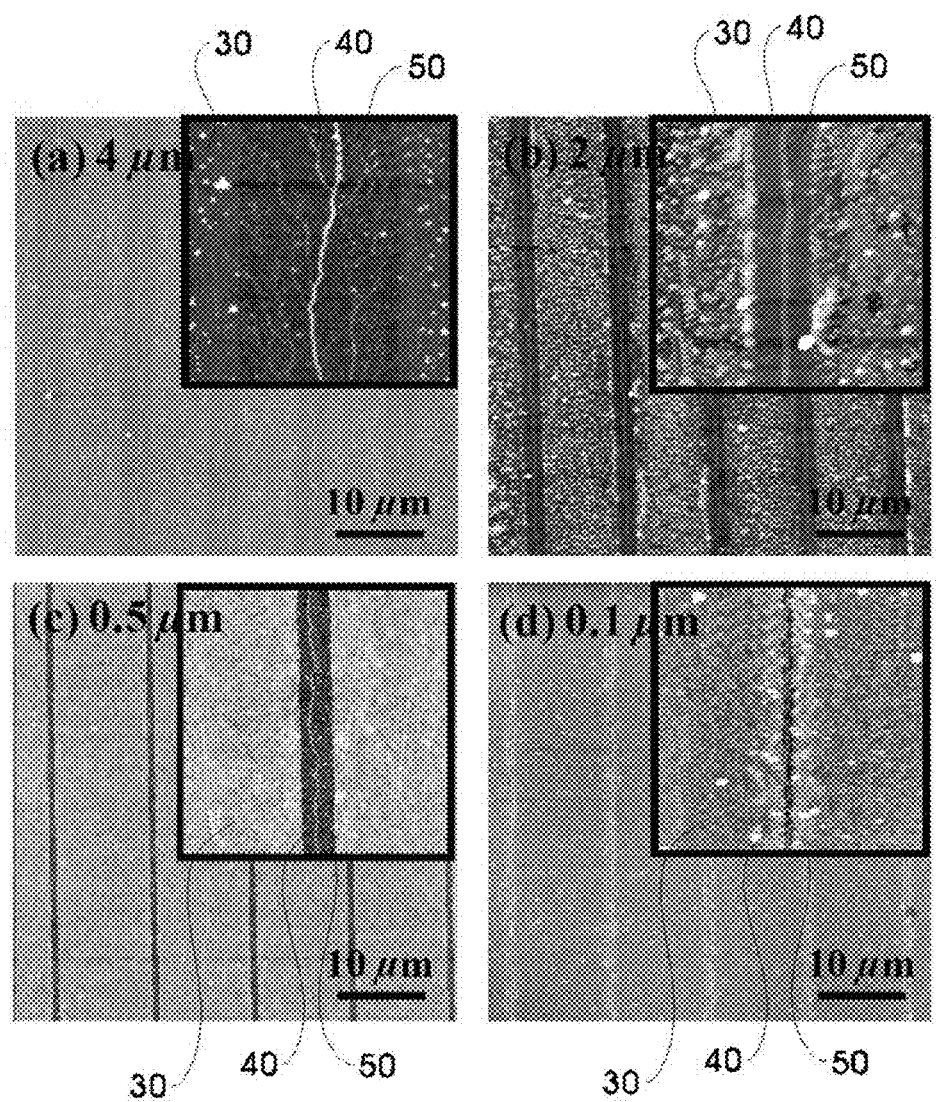
FIGS. 2A to 2D are diagrams illustrating a state where DNA nanostructures are adsorbed in an APS adsorbent layer.

The substrate 10 may employ an Si wafer, a wafer having SiO2 deposited thereon, a glass substrate, a glass substrate coated with a transparent conductive oxide film, a flexible substrate such as polyimide. A photoresist pattern 20 having a line width in the micrometer unit is formed on the substrate 10 using a photolithography process. Here, it is preferable that the line width of the photoresist pattern 20 and the gap between the photoresist patterns 20 are 2 μm or less. This is because the nanostructures can be properly adsorbed when the line width of the adsorbent layer is about 2 μm, as shown in FIG. 2B. This is also because the nanostructures are adsorbed in the center of the adsorbent layer having the highest potential energy.

FIG. 7B shows a state where a first adsorbent layer is formed in an area in which the photoresist pattern is not formed on the substrate.

A positively-charged or negatively-charged first adsorbent layer 41 is formed in the areas in which the photoresist pattern 20 is not formed. APS (AminoPropyltriethoxySilane) or MHA (16-MercaptoHexadecanonic Acid) can be used as the material of the adsorbent layer 40. The APS is charged with positive charges and the MHA is charged with negative charges. The material of the first adsorbent layer 41 is determined depending on the electrostatic characteristic of the nano-material to be positioned on the substrate.

FIG. 7C is shows a state where the photoresist pattern is removed. Spaces exposing the surface of the substrate 10 are formed in the first adsorbent layer 41.

FIG. 7D shows a state where a second adsorbent layer is formed.

The second adsorbent layer 42 charged in the opposite polarity of the first adsorbent layer is formed in the areas from which the photoresist pattern is removed. Accordingly, two adsorbent layers charged in opposite polarities are formed.

FIG. 7E shows a state where first nanostructures are selectively positioned on the first adsorbent layer.

The first nanostructures 51 can be selectively formed on the first adsorbent layer 41 using a solution containing the first nano-material to be positioned on the first adsorbent layer 41. The nano-material includes nano-materials such as carbon nano-tubes, nanolines, metallic nanoparticles, semiconductor nanoparticles, magnetic nanoparticles, bio nanoparticles, and DNAs and new nano-materials formed by combinations thereof. The nano-material is charged positively or negatively and is adsorbed in the first adsorbent layer 41 charged oppositely by an electrostatic attraction.

FIG. 7F shows a state where second nanostructures are selectively positioned on the second adsorbent layer.

The second nanostructures 52 can be selectively formed on the second adsorbent layer 42 using a solution containing the second nano-material to be positioned on the second adsorbent layer 42. The nano-material includes nano-materials such as carbon nano-tubes, nanolines, metallic nanoparticles, semiconductor nanoparticles, magnetic nanoparticles, bio nanoparticles, and DNAs and new nano-materials formed by combinations thereof. The nano-material is charged positively or negatively and is adsorbed in the second adsorbent layer 42 charged oppositely by an electrostatic attraction.

In this embodiment, two methods can be used to form the first nanostructures 51 and the second nanostructure 52. In the first method, a first nano-material-containing solution and a second nano-material-containing solution are sequentially applied onto the substrate on which the adsorbent layers are formed. The first nanostructures 51 and the second nanostructures 52 are formed by the electrostatic attraction and repulsion. In the second method, a solution containing both the first nano-material and the second nano-material is applied onto the substrate on which the adsorbent layers are formed. A specific nanostructure can be formed at a desired position by the electrostatic attraction and repulsion. Proper nanolines can be formed without adjusting the line widths of the adsorbent layers in the nanometer unit. This is because the electrostatic forces of two adsorbent layers charged in different polarities affect each other.

To form a circuit using the nanostructures, it is necessary to selectively position the nano-material at specific positions and to arrange the nano-material in a specific direction. Two methods are used to arrange the nanostructures in the invention. In the first method, a solution containing the nanostructures to be adsorbed is applied to the surface of the substrate on which the adsorbent layer is formed, the substrate is inclined in a specific direction to cause the solution to flow on the substrate, and the nanostructures are thus arranged in a predetermined direction. In the second method, the substrate on which the adsorbent layer is formed is immersed in the solution containing the nanostructures to be adsorbed, the substrate is drawn in a specific direction to cause the solution on the substrate to flow in a predetermined direction, and the nanostructures are thus arranged in a predetermined direction. In addition, by setting the substrate inclining or drawing direction to be different at the time of forming the first nanostructures 51 and at the time of forming the second nanostructures 52 while sequentially forming the first nanostructures 51 and the second nanostructures 52, it is possible to selectively form two nanostructures arranged in different directions.

Although not shown in FIGS. 7A to 7F, another nano-material may be secured onto the nanostructures to form composite nanostructures. Since the nanostructures 51 and 52 selectively positioned and arranged are changed positively or negatively as described above, it is possible to form the composite nanostructures by securing other nanostructures charged oppositely thereon. These composite nanostructures can be formed in various forms using the electrostatic attraction and can be developed for various applications such as sensors amplifying a signal.

Specific exemplary embodiments of the invention have been shown and described above. However, the invention is not limited to the above-mentioned embodiments, but may be modified in various forms by those skilled in the art without departing from the technical spirit of the invention. Therefore, the scope of the invention will be determined by the appended claims, not the above-mentioned specific embodiments.

What is claimed is:

1. A method of selectively positioning nanostructures on a substrate, comprising:
   a first step of forming a photoresist pattern on the substrate and then control the line width of the photoresist pattern in a nano unit to form a nanometer photoresist layer, wherein the first step of controlling the line width of the photoresist pattern employs an ashing process;
   a second step of forming a protective layer for preventing adsorption of a nano-material in a pattern-unformed area on the substrate on which the nanometer photoresist layer has been formed;
   a third step of removing the photoresist layer formed on the substrate;
   a fourth step of forming a positively-charged or negatively charged adsorbent layer in the area from which the photoresist layer has been removed; and
   a fifth step of applying a nano-material-containing solution charged in the opposite polarity of the adsorbent layer to the substrate on which the adsorbent layer has been formed.

2. The method according to claim 1, wherein the protective layer in the second step is formed of OTS (Octadecyl Trichloro Silane).

3. The method according to claim 1, wherein the positively-charged adsorbent layer in the fourth step is formed of APS (AminoPropyltriethoxy Silane).

4. The method according to claim 1, wherein the negatively-charged adsorbent layer in the fourth step is formed of MHA (16-MercaptoHexadecanonic Acid).

5. The method according to claim 1, wherein the fifth step of applying the nano-material-containing solution includes causing a nanostructure-containing solution to flow on the surface of the substrate which is inclined and which has the adsorbent layer formed thereon.

6. The method according to claim 1, wherein the fifth step of applying the nano-material-containing solution includes immersing the substrate having the adsorbent layer formed thereon in the nano-material-containing solution and drawing the substrate to one side.

7. The method according to claim 1, further comprising a sixth step of applying a second nano-material-containing solution, which is charged in the opposite polarity of the nanostructures, to the substrate on which the negatively-charged or positively-charged nanostructures are selectively positioned in the fifth step.

8. A method of selectively positioning nanostructures on a substrate, comprising:
   a first step of forming a photoresist pattern on the substrate;
   a second step of forming a first adsorbent layer, which is positively or negatively charged, in a pattern-unformed area on the substrate having the photoresist layer formed thereon;
   a third step of removing the photoresist layer formed on the substrate;
   a fourth step of forming a second adsorbent layer, which is charged in the opposite polarity of the first adsorbent layer, in an area from which the photoresist layer has been removed; and
   a fifth step of applying a first nano-material-containing solution which is positively charged and a second nano-material-containing solution which is negatively charged to the substrate on which the first and second adsorbent layers have been formed,
   wherein the first or second adsorbent layer, when negatively-charged, is formed of MHA (16-MercaptoHexadecanonic Acid).

9. The method according to claim 8, wherein the positively-charged adsorbent layer is formed of APS (AminoPropyltriethoxy Silane).

10. The method according to claim 8, wherein the first nano-material-containing solution and the second nano-material-containing solution are sequentially applied in the fifth step.

11. The method according to claim 8, wherein a solution containing both a first nano-material and a second nano-material is applied in the fifth step.

12. The method according to claim 8, wherein the fifth step of applying the nano-material-containing solution includes causing a nanostructure-containing solution to flow on the surface of the substrate which is inclined and which has the adsorbent layer formed thereon.

13. The method according to claim 8, wherein the fifth step of applying the nano-material-containing solution includes immersing the substrate having the adsorbent layer formed thereon in the nano-material-containing solution and drawing the substrate to one side.

14. The method according to claim 8, further comprising a sixth step of applying a nano-material-containing solution, which is charged in the opposite polarity of the nanostructures, to the substrate on which the negatively-charged or positively-charged nanostructures are selectively positioned in the fifth step.

15. A method of selectively positioning nanostructures on a substrate, comprising:
 a first step of forming a photoresist pattern on the substrate and then control the line width of the photoresist pattern in a nano unit to form a nanometer photoresist layer;
 a second step of forming a protective layer for preventing adsorption of a nano-material in a pattern-unformed area on the substrate on which the nanometer photoresist layer has been formed, wherein the protective layer in the second step is formed of DLC (Diamond-Like Carbon);
 a third step of removing the photoresist layer formed on the substrate;
 a fourth step of forming a positively-charged or negatively charged adsorbent layer in the area from which the photoresist layer has been removed; and
 a fifth step of applying a nano-material-containing solution charged in the opposite polarity of the adsorbent layer to the substrate on which the adsorbent layer has been formed.

\* \* \* \* \*